(12) United States Patent
Otsuki et al.

(10) Patent No.: US 8,766,273 B2
(45) Date of Patent: Jul. 1, 2014

(54) ORGANIC EL DISPLAY AND METHOD OF MANUFACTURING ORGANIC EL DISPLAY

(75) Inventors: Shigeyoshi Otsuki, Koganei (JP); Toshimasa Eguchi, Koganei (JP); Shinya Yamaguchi, Koganei (JP); Mamoru Okamoto, Koganei (JP)

(73) Assignees: Sumitomo Chemical Company, Limited, Tokyo (JP); Sumitomo Bakelite Co., Ltd., Tokyo (JP)

( * ) Notice: Subject to any disclaimer, the term of this patent is extended or adjusted under 35 U.S.C. 154(b) by 62 days.

(21) Appl. No.: 13/580,847

(22) PCT Filed: Mar. 4, 2010

(86) PCT No.: PCT/JP2010/053510
§ 371 (c)(1),
(2), (4) Date: Dec. 10, 2012

(87) PCT Pub. No.: WO2011/104893
PCT Pub. Date: Sep. 1, 2011

(65) Prior Publication Data
US 2013/0069045 A1    Mar. 21, 2013

(30) Foreign Application Priority Data
Feb. 26, 2010    (JP) .................................. 2010-042390

(51) Int. Cl.
*H01L 27/14*    (2006.01)

(52) U.S. Cl.
USPC .................. 257/72; 257/57; 257/59; 257/64; 257/65; 257/98; 438/149; 438/150; 438/151; 438/152; 438/158

(58) Field of Classification Search
CPC ............ H01L 27/1251; H01L 27/3248; H01L 27/3258; H01L 27/3274; H01L 29/4908
See application file for complete search history.

(56) References Cited

U.S. PATENT DOCUMENTS 6,246,070 B1 *    6/2001    Yamazaki et al. .............. 257/40

* cited by examiner

*Primary Examiner* — Kyoung Lee
(74) *Attorney, Agent, or Firm* — Flynn, Thiel, Boutell & Tanis, P.C.

(57) ABSTRACT

It is possible to manufacture a large-size, high-accuracy organic EL display using a plastic substrate and an organic EL display using a roll-shaped long plastic substrate.

The organic EL display includes an organic EL device A having at least a lower electrode 300, an organic layer including at least a light emitting layer, and an upper electrode 305 and a thin film transistor B on a transparent plastic substrate 100, a source electrode or drain electrode of the thin film transistor B is connected to the lower electrode 300, the plastic substrate 100 has a gas barrier layer 101a, the thin film transistor B is formed on the gas barrier layer 101a, the thin film transistor B includes an active layer 203 containing a non-metallic element which a mixture of oxygen (O) and nitrogen (N) and has a ratio of N to O (N number density/O number density) from 0 to 2, and the organic EL device A is formed at least on the gas barrier layer 101a or one the thin film transistor B.

16 Claims, 7 Drawing Sheets

ORGANIC EL DISPLAY AND METHOD OF MANUFACTURING ORGANIC EL DISPLAY

BACKGROUND OF THE INVENTION

1. Field of the Invention

The present invention relates to an organic EL display which is formed by using, particularly, a plastic substrate and is driven by a thin film transistor including an active layer containing a non-metallic element and a method of manufacturing the organic EL display.

2. Description of the Related Art

Recently, as development of technologies for materials, manufacturing, driving circuits, and the like, a technology for electroluminescence (EL) has been put to practical use of an organic EL display as one of flat panel displays (FPDs).

In 1997, a monochromatic organic EL display was put to practical use. After that, area colorization of the organic EL display is implemented, so that the use thereof is expended to displays such as a small-size audio apparatus or a mobile terminal. In 2001, the colorization was put to practical use by a passive-matrix-type color display for a mobile phone. After that, an active-matrix-type colorization has been made by using thin film transistors. In 2007, the organic EL display was adopted to 11-inch TVs. Recently, large-size TVs having 40 inches or more has been developed.

In an organic EL device configuring an organic EL display, an electron injection layer, an electron transport layer, a light emitting layer, a hole transport layer, a hole injection layer, and the like are stacked between positive and negative electrodes, and a current is allowed to flow in the organic EL device by applying a voltage between the positive and negative electrodes, so that light is emitted. A plurality of display pixels constructed with the organic EL devices are two-dimensionally arranged and used as a display.

For the colorization of an organic EL display, various methods such as a paint division method, a color conversion method, a micro-cavity method, or a color filter method have been proposed. Among these methods, the paint division method and the color filter method are representative methods.

In the paint division method, a display pixel is divided into a plurality of pixels, which are called sub-pixels as devices for emitting light of red (R), green (G), and blue (B). Four colors including white (W) and the three colors of RGB may be used for the sub-pixels.

In the color filter method, white light is emitted, and an RGB color filter is combined with the sub-pixels, so that the colorization is implemented. Similarly to the paint division method, the color filter for the sub-pixels may include four colors of white (W) and the RGB.

The organic EL device is a surface-shaped self light-emitting device made of a totally solid state material. In comparison with a liquid crystal display, a plasma display, or the like, the organic EL display using the organic EL device is excellent in terms of thin device implementation, a high-speed responsibility, characteristics of viewing angle, and the like. Recently, a flexible display using a plastic substrate has been developed. As a driving method of the organic EL display, there are a passive matrix type and an active matrix type.

In the passive matrix type, positive and negative electrodes of the organic EL device as interdigitated electrodes are disposed in the X and Y directions; the one electrode is used as a scan electrode; and the other electrode is used as a data electrode. Light is emitted by applying a voltage from an external constant current circuit to the pixels at the intersections. Since the thin film transistor for driving the organic EL device is unnecessary, the passive matrix type has an advantage in terms of production cost in comparison with the later-described active matrix type. However, since the number of scan electrodes is increased as the number of pixels in the display screen is increased, the duty ratio of driving the pixel is decreased. Therefore, there is a limitation in that high luminance may not be obtained.

In the active matrix type, turning ON and OFF of the thin film transistor (TFT) is performed for each pixel, so that the lighting state is maintained by holding capacitance (condenser). Therefore, high luminance can be sustained although the number of pixels is increased. Accordingly, the active matrix type can be used for the applications such as TVs where the number of pixels is large.

In an active matrix type liquid crystal display, one transistor for selecting pixels is sufficient. However, in the case of an active matrix type organic EL display, at least two TFTs are needed. In other words, besides the transistor for selecting the pixels, a transistor for allowing a current to flow in the organic EL device of the selected pixel and allowing the organic EL device to emit light is needed. Therefore, if an aperture ratio of the display is considered, in the case of the organic EL display, the size of the TFT becomes an important problem in comparison with the case of a liquid crystal display. If the size of the TFT is small, the aperture ratio of the display can be increased.

The TFT using an oxide thin film as the active layer is transparent with respect to visible light, so that it can be expected that the aperture ratio of the display is increased.

As TFTs used to an active matrix type, an a-Si TFT using an amorphous silicon (a-SI) as the active layer and a low-temperature p-Si TFT using a low-temperature polysilicon (low-temperature p-Si) as the active layer are put to practical use and widely used as a liquid crystal display (refer to JP 2008-59824 A).

In this manner, in order to implement a large-size, high-accuracy organic EL display using an organic EL device, an active matrix driving type needs to be selected as described above. In this case, if an a-Si TFT is used as the TFT, since the field effect mobility is about $0.5 \text{ cm}^2/\text{Vs}$, in the case where the area of the pixel is large or the case where the number of scan electrodes is large, for example, 2,000 or more, there is a problem in terms of high-speed responsibility and high luminance. In other words, in the case where the size of the pixel of the organic EL device is large, in order to flow a sufficient current, the size of the TFT needs to be large. However, the aperture ratio of the pixel is decreased, so that high luminance may not be implemented. In addition, in the case where the number of scan electrodes is large due to high accuracy, as the number of scan electrodes is increased, the writing time is shortened. Therefore, a sufficient time for charging the holding capacitance may not be secured, so that turning on of the TFT may not be satisfactorily performed.

In addition, in the a-Si TFT, a change in the reverse voltage Vt due to current stress is large, so that the occurrence of unbalance of the driving current is inevitable for a long time of the driving. In the organic EL device, the unbalance of the driving current leads to irregularity in luminance.

On the other hand, in the case where a low-temperature p-Si TFT is used, the mobility is in a range from $50 \text{ cm}^2/\text{Vs}$ to $150 \text{ cm}^2/\text{Vs}$, so that the TFT can be sufficiently adopted to the driving of a large-size, high-accuracy organic EL display. In addition, since a change in Vt due to the current driving is smaller by two digits or more than that of the a-Si, there is no problem.

However, in the manufacturing of the low-temperature p-Si, in order to perform molten crystallization of a silicon film, excimer laser beams are needed; and in the case of a large-size display, an excimer laser beam having a length corresponding to a screen width is needed. In the current state, the maximum length of the laser beam is 465 mm, and thus, a display having a width more than the maximum length may not be manufactured by using a low-temperature p-Si.

In addition, with respect to the low-temperature p-Si TFT, since the manufacturing process temperature is high, from 500° C. to 600° C., the plastic substrate may not be used. Therefore, it is difficult to implement a flexible display.

SUMMARY OF THE INVENTION

The invention is to provide a large-size, high-accuracy organic EL display using a plastic substrate and a method of manufacturing an organic EL display using a roll-shaped long plastic substrate.

In order to solve the aforementioned problems and achieve the objects, the invention is configured as follows.

According to a first aspect of the present invention, there is provided an organic EL display which includes an organic EL device having at least a lower electrode, an organic layer including at least a light emitting layer, and an upper electrode and a thin film transistor on a transparent plastic substrate, wherein a source electrode or a drain electrode of the thin film transistor is connected to the lower electrode, wherein the plastic substrate has a gas barrier layer, wherein the thin film transistor is formed on the gas barrier layer, wherein the thin film transistor includes an active layer containing a non-metallic element which is a mixture of oxygen (O) and nitrogen (N) and has a ratio of N to O (N number density/O number density) from 0 to 2, and wherein the organic EL device is formed at least on the gas barrier layer or on the thin film transistor.

A second aspect is the organic EL display according to the first aspect, wherein a short-side length of a display screen of the organic EL display is 465 mm or more.

A third aspect is the organic EL display according to the first aspect, wherein the organic EL device includes layers of emitting at least three primary colors of red (R), green (G), and blue (B).

A fourth aspect is the organic EL display according to the first aspect, wherein the organic EL device includes at least a white light emitting layer and a color filter layer.

A fifth aspect is the organic EL display according to the first aspect, wherein the thin film transistor is transparent, wherein a portion of the organic EL device is two-dimensionally and continuously formed through a transparent insulating layer on the thin film transistor, and wherein the lower electrode of the organic EL device is transparent.

A sixth aspect is the organic EL display according to the first aspect, wherein the upper electrode of the organic EL device is a light-reflective electrode.

A seventh aspect is the organic EL display according to the first aspect, wherein the thin film transistor includes a cohesive layer or an adhesive layer at a side of the gas barrier layer.

An eighth aspect is the organic EL display according to the seventh aspect, wherein the thin film transistor includes a glass substrate.

A ninth aspect is the organic EL display according to the first aspect, wherein the thin film transistor is directly formed on the plastic substrate.

According to a tenth aspect of the present invention, there is a method of manufacturing the organic EL display according to any one of the first to ninth aspects, including at least: forming an organic EL device portion by forming at least a lower electrode, an organic layer including at least a light emitting layer, and an upper electrode on a transparent plastic substrate; forming a gas barrier layer on the transparent plastic substrate which has a shape of a long roll; forming a thin film transistor by forming an active layer containing a non-metallic element which is a mixture of oxygen (O) and nitrogen (N) and has a ratio of N to O (N number density/O number density) from 0 to 2 on the gas barrier layer through a sputtering method; and forming the organic EL device at least on the gas barrier layer or on the thin film transistor.

An eleventh aspect is the method according to the tenth aspect, wherein a short-side length of a display screen of the organic EL display is 465 mm or more.

A twelfth aspect is the method according to the tenth aspect, further including a step of forming layers of emitting at least three primary colors of red (R), green (G), and blue (B) in the organic EL device.

A thirtieth aspect is the method according to the tenth aspect, further including a step of forming at least a white light emitting layer and a color filter layer in the organic EL device.

A fourteenth aspect is the method according to the tenth aspect, wherein the thin film transistor is transparent, wherein a portion of the organic EL device is two-dimensionally and continuously formed through a transparent insulating layer on the thin film transistor, and wherein the electrode of the organic EL device is transparent.

A fifteenth aspect is the method according to the tenth aspect, wherein the thin film transistor is formed by being transferred to the plastic substrate through a cohesive layer or an adhesive layer, after the thin film transistor is formed on a glass substrate in advance and a portion or the entire of the glass substrate is removed.

A sixteenth aspect is the method according to the tenth aspect, wherein the thin film transistor is directly formed on the plastic substrate.

According the above configurations of the invention, the following effects can be obtained.

In the invention disclosed in claim 1, even in the case where the thin film transistor including an active layer containing a non-metallic element which is a mixture of oxygen (O) and nitrogen (N) and has a ratio of N to O (N number density/O number density) from 0 to 2 is formed at a temperature of 200° C. or less, the performance is equivalent to or higher than performance of a thin film transistor using amorphous silicon formed on a glass substrate at 200° C. or more. The embodiment is very appropriate for the case where the thin film transistor is formed on a plastic substrate of which the heat resistant temperature is lower than that of a glass substrate. On the other hand, the organic EL device is a self light-emitting device made of a totally solid state material and has no dependency of a viewing angle, and the organic EL device is very appropriate for a device of a flexible display formed on a plastic substrate. In addition, it is possible to easily obtain a thin film transistor having a high field effect mobility, so that the thin film transistor is very appropriate for a large-screen, high-accuracy display using an organic EL device which is a current-driven device.

In the invention disclosed in claim 2, a short-side length of a display screen of the organic EL display C is 465 mm or more. In a large-screen, high-accuracy organic EL display, low-temperature P-Si TFTs can be adopted. However, with respect to the size of a display screen using the low-temperature P-Si TFTs, a laser annealing apparatus which is an expensive manufacturing apparatus is needed, and due to the limitation of the size of the laser annealing apparatus, if the short-side length is not 465 mm or less, mass production may not be made. But, in the embodiment, due to the thin film transistors B, it is possible to manufacture a manufacturing apparatus for the display screen having a short-side length of 465 mm or more with a relatively low production cost.

In the invention disclosed in claim 3, in the case where full-color display is performed by an organic EL display, a configuration for emitting light of at least three primary colors of red (R), green (G), and blue (B) is needed. In this case, since the emitted light of the organic EL device A is directly used as it is, in the full-color display method, the highest light use efficiency is preferred, and a configuration for emitting light of four colors or six colors including white (W), yellow (Y), cyan (C), and the like in addition to RGB may be used.

In the invention disclosed in claim 4, the organic EL device includes at least a white light emitting layer and a color filter layer. Instead of emitting light of three primary colors or light of four colors to six colors, full color display can be made by using a white light emitting layer and a color filter layer. In this case, since only a single white light emitting layer may be formed as the light emitting layer, there is no need to form separate light emitting layers for different colors of the emitted light. Therefore, the number of processes can be reduced, and the manufacturing apparatus is more simplified, so that it is possible to obtain the effective in that the manufacturing can be performed with a more inexpensive apparatus. Similarly to a color liquid crystal panel, the full color display is performed by allowing the light from the white light emitting layer to transmit through the color filter layer.

In the invention disclosed in claim 5, since transparent materials are used for the thin film transistor, the insulating planarizing layer 300 as an insulating material, and the lower electrode of the organic EL device, although a large-size thin film transistor is used, the light emission of the organic EL device can be used for display without blocking thereof. Accordingly, an aperture ratio of the display can be increased, and light use efficiency can be improved, so that the embodiment is appropriate for saving energy.

In the invention disclosed in claim 6, since the upper electrode of the organic EL device is configured with a light-reflective electrode, among the light generated from the organic EL device, the light propagating toward the upper side in the opposite direction of the display side is also reflected toward the display-side direction by the upper electrode, so that the light can be effectively used for display. Accordingly, there is an advantage in that the light use efficiency of the organic EL device A can be improved.

In the invention disclosed in claim 7, a cohesive layer or an adhesive layer is provided to the side of the gas barrier layer of the plastic substrate, so that the separately-produced thin film transistor can be attached to be fixed on the plastic substrate by using the cohesive layer or the adhesive layer. In addition, a roll-to-roll method where taking out from the rolled state and winding to the rolled state are performed can be used during the manufacturing. Therefore, even in the case where there is no equipment for forming a thin film transistor B on a long substrate, there is an advantage in that a thin film transistor substrate manufactured separately in a sheet shape can be used.

In the invention disclosed in claim 8, with respect to a thin film transistor which requires a high-temperature process so that the thin film transistor may not be directly formed on the plastic substrate, there is an advantage in that, after the thin film transistor is separately produced on the glass substrate, the thin film transistor can be used in the state where the thin film transistor is attached on the plastic substrate by using a cohesive layer or an adhesive layer. In this case, if the thickness of the glass substrate is reduced by etching using hydrogen fluoride water or the like or by polishing using a polishing agent, it is possible to effectively reduce the thickness of the device.

In the invention disclosed in claim 9, if the thin film transistor is directly formed on the plastic substrate, since the substrate is flexible, the substrate is very appropriate for a flexible display. In addition, in the case where the display is an organic EL display, the organic EL device is a totally-solid-state device and has no dependency of a viewing angle. Therefore the organic EL device is very appropriate for a flexible display.

In the invention disclosed in any one of claims 10 to 16, it is possible to manufacture the organic EL display according to any one of claims 1 to 9.

DETAILED DESCRIPTION OF EMBODIMENTS

Hereinafter, an organic EL display and a method of manufacturing an organic EL display according to embodiments of the invention will be described. Although these embodiments are exemplary embodiments, the invention is not limited thereto.

First, embodiments of an organic EL display will be described.

Organic EL Display

First Embodiment

Figure 1:
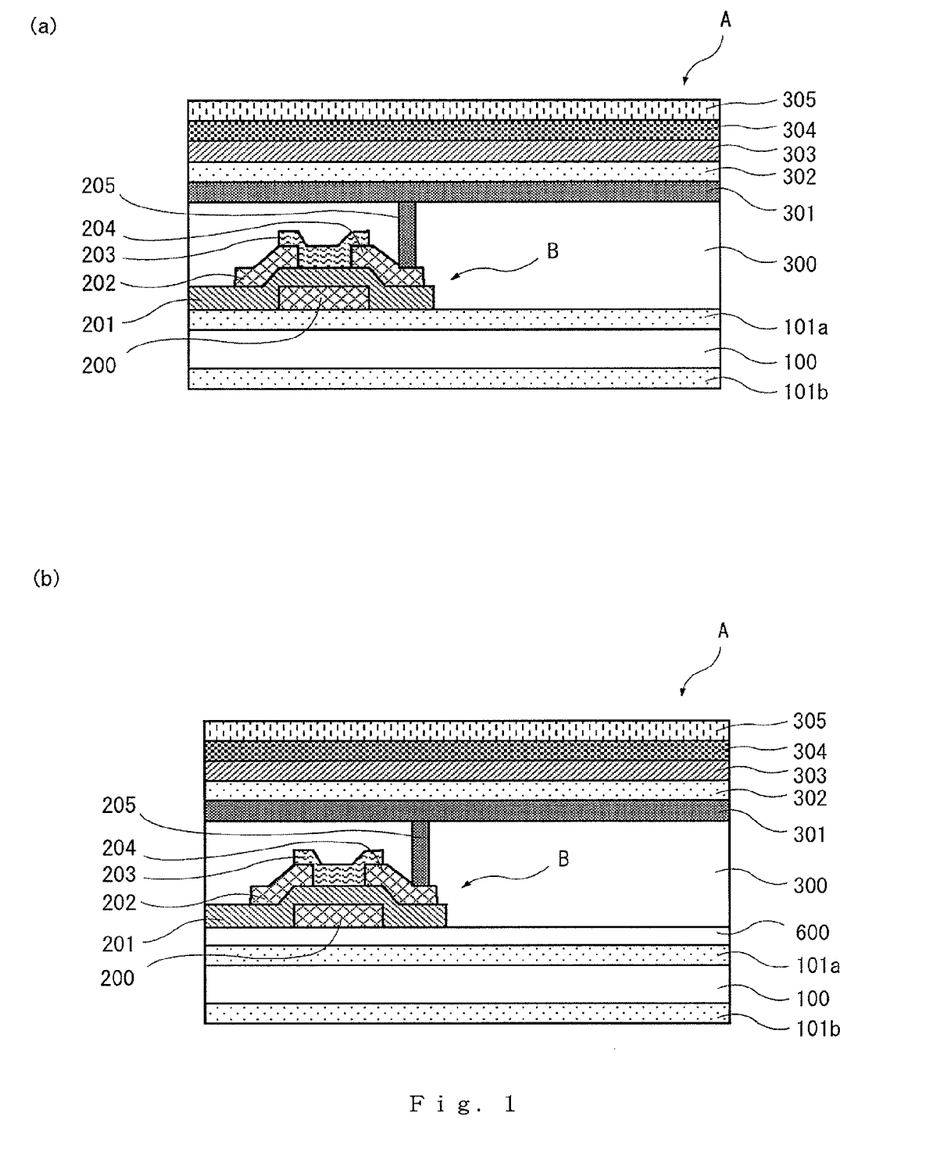
FIG. 1 is a schematic cross-sectional diagram illustrating an organic EL display according to a first embodiment.

FIG. 1 is a schematic cross-sectional diagram illustrating an organic EL display according to a first embodiment. The organic EL display C according to the first embodiment includes organic EL devices A formed at least a lower electrode, an organic layer including at least a light emitting layer, and an upper electrode and thin film transistors B on a transparent plastic substrate 100. The transparent plastic substrate 100 is configured so that a gas barrier layer 101a is formed on an upper surface thereof, and a gas barrier layer 101b is formed on a lower surface thereof.

The thin film transistor B is formed on the gas barrier layer 101a to include a gate electrode 200, a gate insulating layer 201, a source electrode 202, an active layer 203, and a drain electrode 204. The active layer 203 contains a non-metallic element which is a mixture of oxygen (O) and nitrogen (N) and has a ratio of N to O (N number density/O number density) from 0 to 2.

The active layer 203 is made of a combination of a metallic material ($In_2O_3$, $SnO_2$) and an insulating material ($Si_3N_4$).

Although a nitride is used for a metallic material, since the nitride itself is an insulating material, a semiconductor may not be formed through mixture with other insulating materials. Therefore, an oxide which is a metal itself is used as the metallic material. On the contrary, if a nitride is used for an insulating material, a semiconductor produced by mixing the above two materials becomes a mixture of an oxynitride containing oxygen (O) and nitrogen (N). The mixture is expressed by the following formula. The mixture ratios x and y can be determined under the condition that positive and negative atomic values are balanced.

$$(IN_2{}^{3+}O_3{}^{2-})_x(Sn^{4+}O_2{}^{2-})_{6-x}(Si_3{}^{4+}N_4{}^{3-})_y = In_{2x}Sn_{6-x}Si_{3-y}O_{12+x}N_{4y}$$

If the mixture ratio of the main metallic material $In_2O_3$ is x and the mixture ratio of the insulating material $Si_3N_4$ is y, the mixture ratio of the auxiliary metallic material $SnO_2$ becomes 6-x due to the balance of the atomic numbers. The ratio x:y of the metallic material and the insulating material is determined by band gaps of the materials and a band gap of a semiconductor formed after the mixture. For example, it is preferable that the range of x be x=0 to 6 (typical value of 5) and the range of y be y=0 to 6 (typical value of 3).

Accordingly, the amount ratio of O: N is as follows.
0=12 to 18 (typical value of 17)
N=0 to 24 (typical value of 12)
Therefore, O:N=1:0 to 2. The number density ratio of nitrogen to 1 oxygen, that is, the ratio of nitrogen (N) to oxygen (O) (N number density/O number density) is from 0 to 2.

The organic EL device A is formed at least on the gas barrier layer 101a or the thin film transistor B. The organic EL device A include a conductive connection portion 205, an insulating planarizing layer 300, a lower electrode 301 which is a positive electrode of the organic EL device A, a hole transport layer 302, a light emitting layer 303, an electron transport layer 304, and an upper electrode 305 which is a negative electrode of the organic EL device A. Although the lower electrode 301 is electrically connected to the drain electrode 204 of thin film transistor B through a connection portion 205, the lower electrode 301 may be connected to a source electrode 202 of the thin film transistor B.

The gas barrier layers 101a and 101b are obtained by forming a thin film such as SiOx or SiNx through a vacuum layer forming method such as a sputtering method, a CVD method, or a vacuum deposition method. The thickness of the gas barrier layer is, for example, in a range from about 10 nm to about 100 nm.

The gate electrode 200, the source electrode 202, and the drain electrode 204 are obtained by forming a transparent thin film such as indium tin oxide (ITO), indium zinc oxide (IZO), or zinc oxide (ZnO) through a sputtering method, a vacuum deposition method, an ion plating method, or the like. The thickness of the electrode is, for example, in a range from about 50 nm to about 200 nm.

The gate insulating film 201 is obtained by forming a transparent insulating thin film such as $SiO_2$ or $Al_2O_3$ through a sputtering method, a CVD method, a vacuum deposition method, an ion plating method, or the like. The thickness of the gate oxide film is, for example, in a range from about 10 nm to about 1 μm.

In the embodiment, even in the case where the thin film transistor B including an active layer 203 containing a non-metallic element which is a mixture of oxygen (O) and nitrogen (N) and has a ratio of N to O (N number density/O number density) from 0 to 2 is formed at a temperature of 200° C. or less, the performance is equivalent to or higher than performance of a thin film transistor using amorphous silicon formed on a glass substrate at 200° C. or more. The embodiment is very appropriate for the case where the thin film transistor is formed on a plastic substrate of which the heat resistant temperature is lower than that of a glass substrate. On the other hand, the organic EL device A is a self light-emitting device made of a totally solid state material and has no dependency of a viewing angle, and the organic EL device A is very appropriate for a device of a flexible display formed on a plastic substrate. In addition, it is possible to easily obtain a thin film transistor having a high field effect mobility, so that the thin film transistor is very appropriate for a large-screen, high-accuracy display using an organic EL device which is a current-driven device.

In addition, the range from 0 to 2 of the ratio of nitrogen (N) to oxygen (O) (N number density/O number density) is determined based on the band gap and the balance of atomic numbers as described above in "the ratio of nitrogen (N) to oxygen (O) (N number density/O number density) is in a range from 0 to 2". If the value is zero (there is no nitrogen), the band gap of the active layer 7 is too narrow according to the quantity of oxygen, the active layer has metallic properties, so that the thin film transistor B is always in the ON state. On the contrary, if the value is more than 2 (oxygen is insufficient and nitrogen is overabundant), the band gap of the active layer 7 is too wide, the active layer has insulation properties, so that the thin film transistor B is always in the OFF state. In any cases, there are problems in terms of TFT characteristics.

A short-side length of a display screen of the organic EL display according to the embodiment is 465 mm or more. In a large-screen, high-accuracy organic EL display, low-temperature P-Si TFTs can be adopted. However, with respect to the size of a display screen using the low-temperature P-Si TFTs, a laser annealing apparatus which is an expensive manufacturing apparatus is needed, and due to the limitation of the size of the laser annealing apparatus, if the short-side length is not 465 mm or less, mass production may not be made. However, in the embodiment, due to the thin film transistors, it is possible to manufacture a manufacturing apparatus for the display screen having a short-side length of 465 mm or more with a relatively low production cost.

In addition, the thin film transistor B is transparent; a portion of the organic EL device A is two-dimensionally continuously formed through an insulating planarizing layer 300 which is a transparent insulating layer on the thin film transistor B; and a lower electrode 301 of the organic EL device A is transparent. Since transparent materials are used for the thin film transistor B, the insulating planarizing layer 300 as an insulating material, and the lower electrode 301 of the organic EL device A, although a large-size thin film transistor B is used, the light emission of the organic EL device A can be used for display without blocking thereof. Accordingly, an aperture ratio of the display can be increased, and light use efficiency can be improved, so that the embodiment is appropriate for saving energy.

In addition, the upper electrode 305 of the organic EL device A is a light-reflective electrode. Since the upper electrode 305 of the organic EL device A is configured with a light-reflective electrode, among the light generated from the organic EL device A, the light propagating toward the upper side in the opposite direction of the display side is also reflected toward the display-side direction by the upper electrode 305, so that the light can be effectively used for display. Accordingly, there is an advantage in that the light use efficiency of the organic EL device A can be improved.

In addition, the thin film transistor B includes a cohesive layer or an adhesive layer at a side of the gas barrier layer 101a. The cohesive layer or the adhesive layer is provided to the side of the gas barrier layer 101a of the plastic substrate 100, so that the separately-produced thin film transistor B can be attached to be fixed on the plastic substrate 100 by using the cohesive layer or the adhesive layer. In addition, a roll-to-roll method where extracting from the rolled state and winding to the rolled state are performed can be used during the manufacturing. Therefore, even in the case where there is no equipment for forming a thin film transistor B on a long substrate, there is an advantage in that a thin film transistor substrate manufactured separately in a sheet shape can be used.

In addition, the thin film transistor B is directly formed on the plastic substrate 101. In the embodiment, at the side of the gas barrier layer 101a of the plastic substrate 100, the thin film transistor B is directly formed on the plastic substrate 101, and the substrate is flexible. Therefore, the substrate is very appropriate for a flexible display. In addition, in the case where the display is an organic EL display, the organic EL device is a totally-solid-state device and has no dependency of a viewing angle, and the organic EL device is very appropriate for a flexible display.

In addition, as illustrated in FIG. 1B, the thin film transistor B includes a glass substrate 600. In the embodiment, with respect to a thin film transistor which requires a high-temperature process so that the thin film transistor may not be directly formed on the plastic substrate 101, there is an advantage in that, after the thin film transistor is separately produced on the glass substrate 600, the thin film transistor can be used in the state where the thin film transistor is attached on the plastic substrate 101 by using a cohesive layer or an adhesive layer. In this case, if the thickness of the glass substrate 600 is reduced by etching using hydrogen fluoride water or the like or by polishing using a polishing agent, it is possible to effectively reduce the thickness of the device.

Second Embodiment

Figure 2:
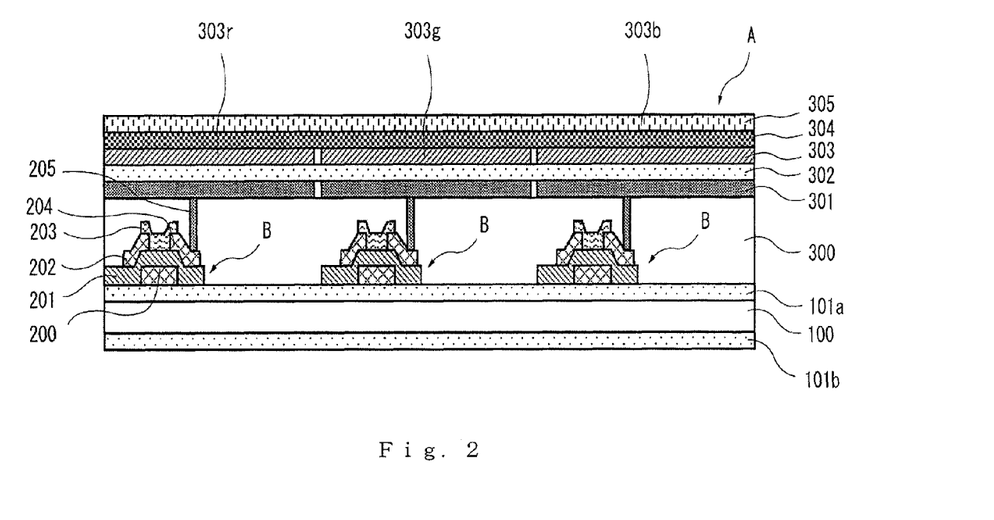
FIG. 2 is a schematic cross-sectional diagram illustrating an organic EL display according to a second embodiment.

FIG. 2 is a schematic cross-sectional diagram illustrating an organic EL display according to a second embodiment. In the organic EL display according to the second embodiment, the same components as those of the first embodiment are denoted by the same reference numerals, and the description thereof will not be made. In the second embodiment, the organic EL device A includes a red light emitting layer 303r, a green light emitting layer 303g, and a blue light emitting layer 303b. The lower electrode 301 which is a positive electrode of organic EL device A is divided corresponding to the red light emitting layer 303r, the green light emitting layer 303g, and the blue light emitting layer 303b, and the thin film transistor B are arranged. The lower electrode 301 is electrically connected through a connection portion 205 to the drain electrode 204 of the thin film transistor B.

In the embodiment, the organic EL device A includes layers of emitting at least three primary colors of red (R), green (G), and blue (B). In the case where full-color display is performed by an organic EL display, a configuration for emitting light of at least three primary colors of red (R), green (G), and blue (B) is needed. In this case, since the emitted light of the organic EL device A is directly used as it is, in the full-color display method, the highest light use efficiency is preferred, and a configuration for emitting light of four colors or six colors including white (W), yellow (Y), cyan (C), and the like in addition to RGB may be used.

Third Embodiment

Figure 3:
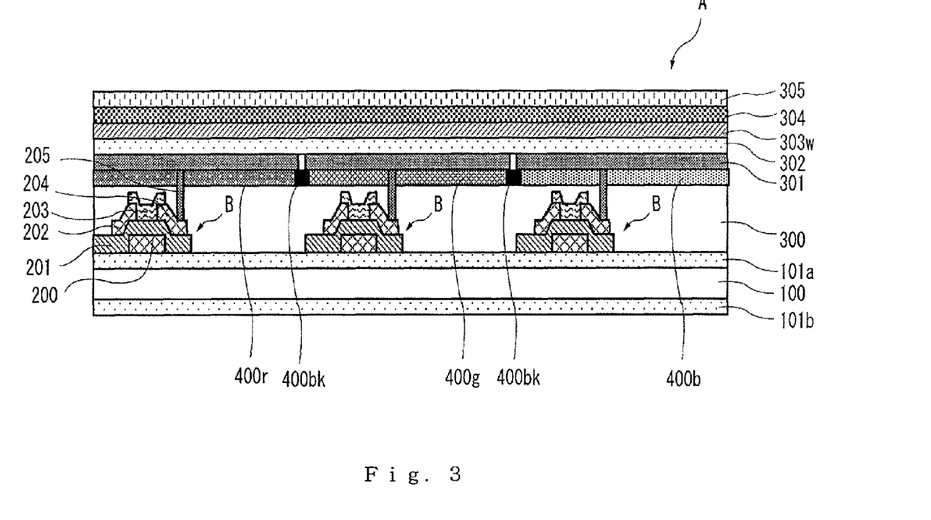
FIG. 3 is a schematic cross-sectional diagram illustrating an organic EL display according to a third embodiment.

FIG. 3 is a schematic cross-sectional diagram illustrating an organic EL display according to a third embodiment. In the organic EL display according to the third embodiment, the same components as those of the first and second embodiments are denoted by the same reference numerals, and the description thereof is omitted. In the third embodiments, the organic EL device A includes a white light emitting layer 303w, and further includes a color filter layer 400r which transmits red light, a color filter layer 400g which transmits green light, a color filter layer 400b which transmits blue light, and black matrix layer 400bk which divides pixels.

In the embodiment, the organic EL device A includes at least a white light emitting layer and a color filter layer. Without emitting light of three primary colors or light of four colors to six colors, full color can be displayed by using a white light emitting layer and a color filter layer. In this case, since only a single white light emitting layer may be formed as the light emitting layer, there is no need to form separate light emitting layers for different colors of the emitted light. Therefore, the number of processes can be reduced, and the manufacturing apparatus is more simplified, so that it is possible to obtain the effective in that the manufacturing can be performed with a more inexpensive apparatus. Similarly to a color liquid crystal panel, the full color display is performed by allowing the light from the white light emitting layer to transmit through the color filter layer.

In addition, in the embodiments of FIGS. 1, 2, and 3, the configuration of the organic EL device A is a basic configuration. The configuration of the organic EL device used in the present invention is not particularly limited to those illustrated in FIGS. 1, 2, and 3, but a well-known organic EL device in the related art may be used as it is.

(Driving of Organic EL Display)

Figure 4:
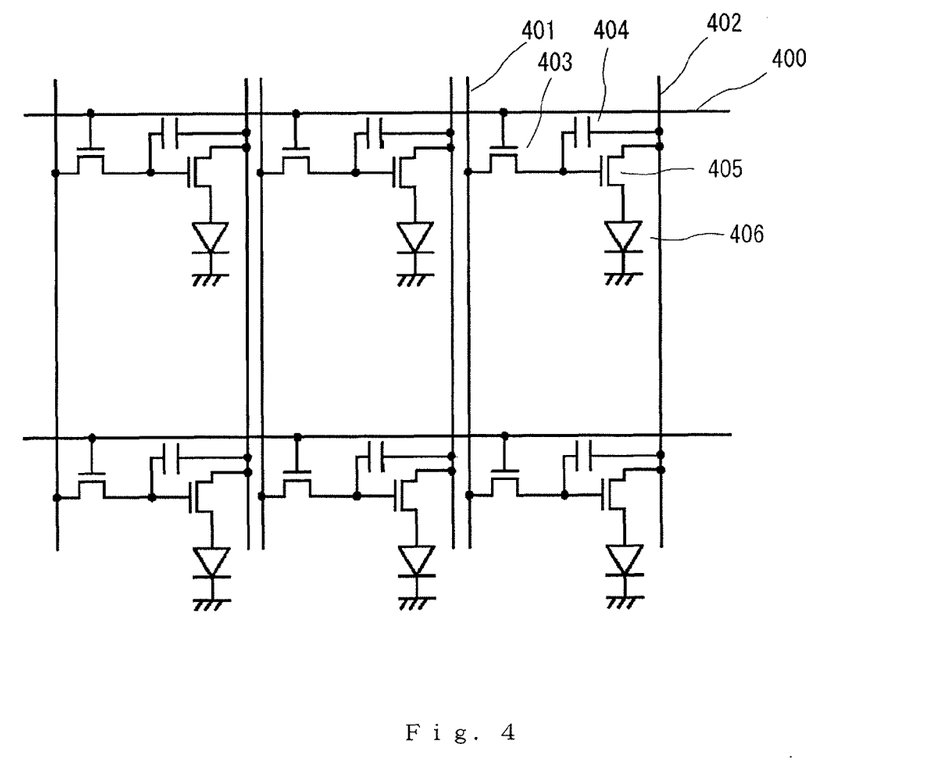
FIG. 4 is a circuit diagram illustrating pixels of an organic EL display according to the invention, of which the driving method is an active matrix driving method using thin film transistors.

Next, driving in the embodiments of FIGS. 1, 2, and 3 will be described. FIG. 4 is a circuit diagram illustrating pixels of the organic EL display according to the present invention, of which the driving method is an active matrix driving method using thin film transistors.

A pixel circuit of the organic EL display according to the embodiment includes a scan line 400, a signal line 401, a power supply line 402, a switching transistor 403, a holding capacitance 404, a driving transistor 405, and an organic EL device 406.

A gate electrode and a drain electrode of the switching transistor 403 are connected to the scan line 400 and the signal line 401, respectively. A gate electrode of the driving transistor 405 is connected to a drain electrode of the switching transistor 403, a source electrode thereof is connected to the power supply line 402, and a drain electrode thereof is connected to a lower electrode which is a positive electrode of the organic EL device 406. An upper electrode which is a negative electrode of the organic EL device 406 is grounded. A holding capacitance 404 is connected between the gate and drain electrodes of the driving transistor 405.

In the embodiment, if a scan signal voltage is applied to the scan line 400, the switching transistor 403 is turned ON, and according to a signal voltage applied from the signal line 401, the holding capacitance 404 is electrically charged, and the driving transistor 405 is turned ON. Therefore, a current corresponding to a conductivity of the driving transistor 405 defined by a voltage of the holding capacitance 404 flows from the power supply line 402 into the organic EL device 406, so that light is emitted.

In addition, the pixel circuit of the organic EL display illustrated in FIG. 4 is a basic example. The pixel circuit according to the present invention is not particularly limited to that illustrated in FIG. 4, but a well-known circuit in the related art may be used as it is.

Next, embodiments of a method of manufacturing an organic EL display will be described.

Manufacturing of Organic EL Display

First Embodiment

Figure 5:
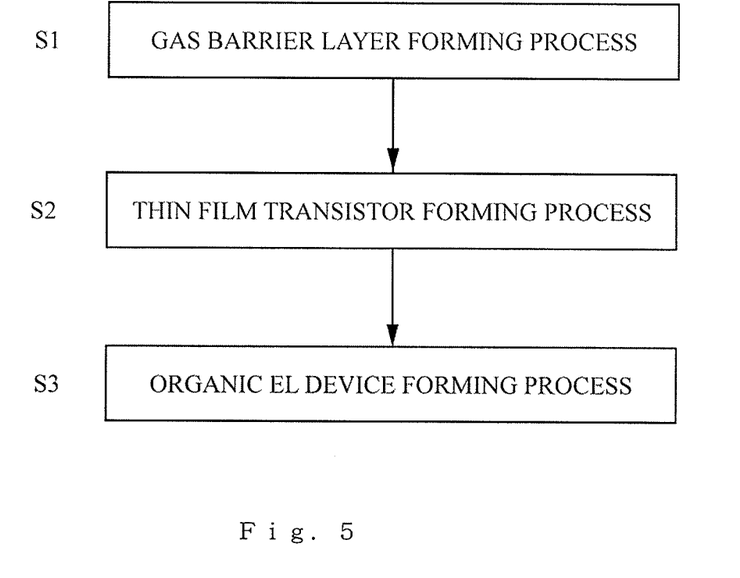
FIG. 5 is a process flowchart illustrating a method of manufacturing an organic EL display.

FIG. 5 is a process flowchart illustrating a method of manufacturing an organic EL display. The method according to the embodiment includes a gas barrier layer forming process S1, a thin film transistor forming process S2, and organic EL device portion forming process S3. In the gas barrier layer forming process S1, gas barrier layers 101a and 101b are formed on a transparent plastic substrate 100 which has a shape of a long roll.

In the thin film transistor forming process S2, an active layer 203 containing a non-metallic element which is a mixture of oxygen (O) and nitrogen (N) and has a ratio of N to O (N number density/O number density) from 0 to 2 is formed on the gas barrier layer 101a through a sputtering method.

In the organic EL device portion forming process S3, a lower electrode 301 which is a positive electrode of the organic EL device A, a hole transport layer 302, a light emitting layer 303, an electron transport layer 304, and an upper electrode 305 which is a negative electrode of the organic EL device A are formed, and at least a lower electrode 301, an organic layer including at least a light emitting layer 303, and an upper electrode 305 are formed on the transparent plastic substrate.

The substrate 100 may formed by using a transparent resin film, and the type thereof is not particularly limited. As an appropriate example of the plastic film, there are polycarbonate, a polysulfone-based resin, an olefin-based resin, a cyclic polyolefin-based resin, and the like. The thickness of the plastic film substrate 3a is, for example, in a range from about 50 to about 200 μm.

The planarizing layer 300 is formed by using a photosensitive transparent resin through a spin coating method, a slit coating method, an inkjet method, or the like. The thickness of the planarizing layer is, for example, in a range from about 100 nm to about 2 μm.

With respect to the connection portion 205, an opening portion is prepared through a photolithography method or the like during the formation of a planarizing layer 300, and the connection portion 205 is formed simultaneously when the lower electrode 301 of the organic EL device is formed.

The lower electrode 301 which is a positive electrode of the organic EL device is obtained by forming a transparent thin film such as indium tin oxide (ITO), indium zinc oxide (IZO), or zinc oxide (ZnO) through a sputtering method, a vacuum deposition method, an ion plating method, or the like. Particularly, it is preferable that ITO be used in terms of high transparency, high conductivity, and the like. The thickness of the electrode is, for example, in a range from about 50 nm to about 200 nm.

With respect to the hole transport layer 302, the light emitting layer 303, and the electron transport layer 304, materials for an organic EL device in the related art can be used.

The upper electrode 305 is obtained by forming lithium fluoride (LiF) having a thickness of 5 nm to 20 nm and aluminum (Al) having a thickness of 50 nm to 200 nm through a vacuum deposition method.

In the embodiment, the configuration of the organic layer of the organic EL device includes a hole transport layer, a light emitting layer, and an electron transport layer. However, in addition to the above components, the configuration may selectively include a hole injection layer, an electron transport layer, a hole blocking layer, an electron blocking layer, or the like of an organic layer in the related art.

In addition, with respect to the method of forming the organic layer, a vacuum deposition method, a plating method, or the like may be appropriately used according to a material used and a configuration of lamination.

Figure 6:
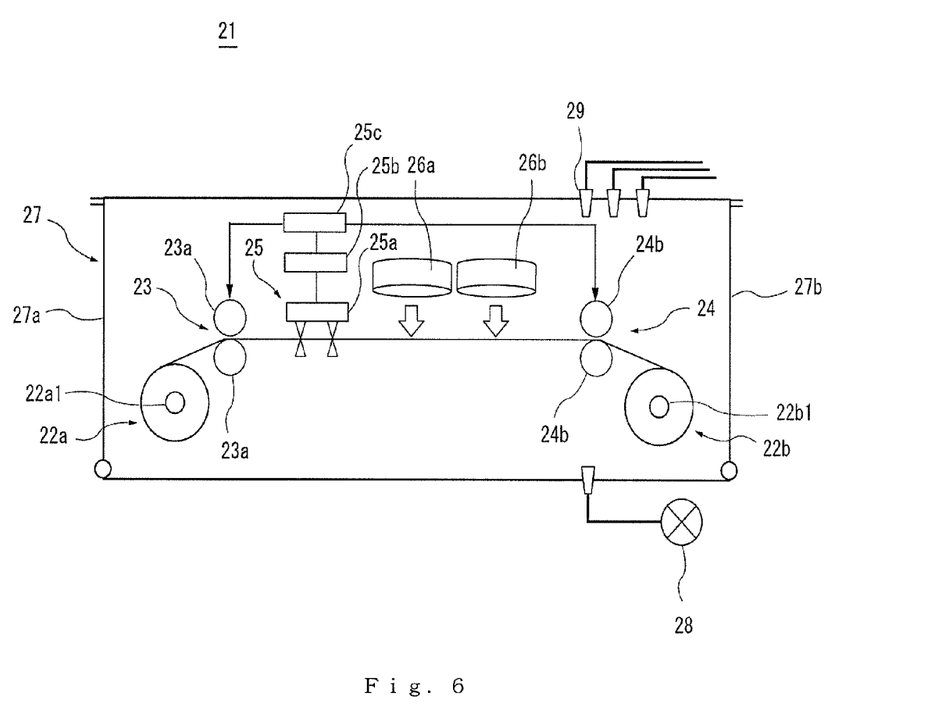
FIG. 6 is a schematic diagram illustrating a configuration of a sputter apparatus.
Figure 7:
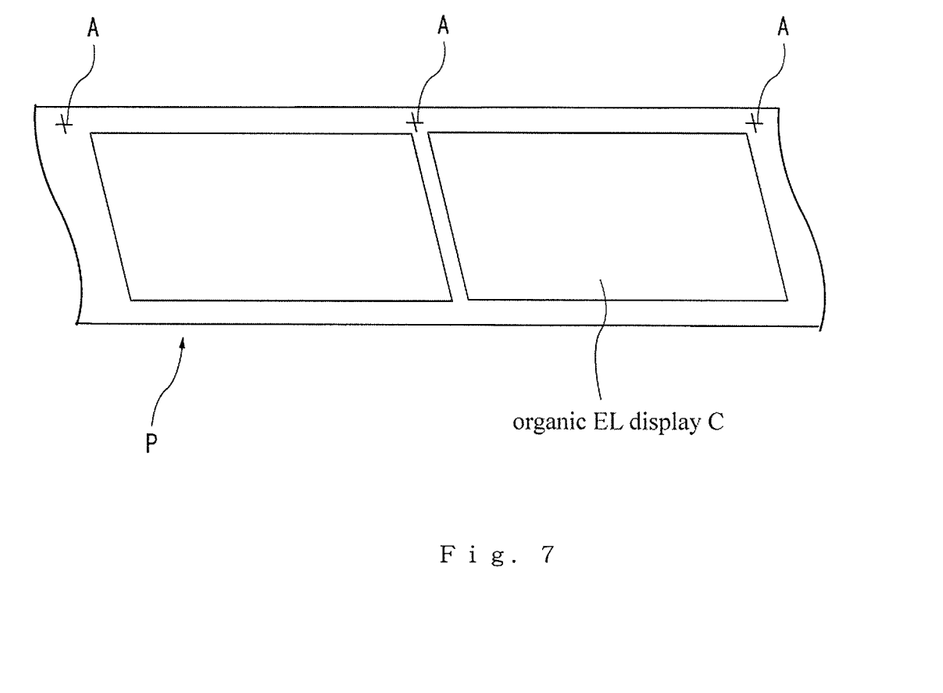
FIG. 7 is a plan diagram illustrating a roll-shaped film substrate.

In the embodiment, an active layer 203 is formed by a sputter apparatus illustrated in FIGS. 6 and 7. The sputter apparatus 21 includes roll-winding mechanisms 22a and 22b, an extracting mechanism 23, a winding mechanism 24, a position-alignment mechanism 25, and metal targets 26a and 26b and is provided with a vacuum chamber 27 which accommodates the aforementioned all components. The vacuum chamber 27 includes opening/closing doors 27a and 27b at the sides of the roll-winding mechanisms 22a and 22b. The opening/closing door 27a is opened and closed so as to set the roll-shaped film substrate P, and the opening/closing door 27b is opened and closed so as to draw out the roll-shaped film substrate P where the active layer 203 is installed.

With respect to the roll-shaped film substrate P, barrier layers 101a and 101b are formed on both surfaces of the plastic substrate 101, and as illustrated in FIG. 7, the roll-shaped film substrate P includes a position-alignment pattern A.

With respect to the roll-winding mechanism 22a, the roll-shaped film substrate P is mounted around the rotation shaft 22a1, and the rotation shaft 22a1 is rotated by extracting of the roll-shaped film substrate P. With respect to the roll-winding mechanism 22b, the roll-shaped film substrate P is mounted around the rotation shaft 22b1, and the rotation shaft 22b1 is rotated by winding of the roll-shaped film substrate P.

The extracting mechanism 23 includes a pair of extracting rollers 23a. When the pair of the extracting rollers 23a are rotated, the roll-shaped film substrate P is extracted from the one end thereof in the longitudinal direction.

The winding mechanism 24 includes a pair of winding rollers 24b. When the pair of the winding rollers 24b are rotated, the roll-shaped film substrate P is wound from the one end thereof in the longitudinal direction.

The position-alignment mechanism 25 includes a detection sensor 25a, a controller 25b, and a roller driving unit 25c. The detection sensor 25a detects the position-alignment pattern A of the roll-shaped film substrate P, and detection information is transmitted to the controller 25b. The controller 25b controls the extracting mechanism 23 and the winding mechanism 24 through the roller driving unit 25c, so that plane position alignment of the roll-shaped film substrate P is performed.

The vacuum chamber 27 is allowed to be in a vacuum state by driving a vacuum pump 28. A gas introduction mechanism 29 is installed in the vacuum chamber 27. The gas introduction mechanism 29 allows an atmosphere gas containing a non-metallic element to be introduced into the vacuum chamber 27.

The metal targets 26a and 26b face a semiconductor forming surface of the roll-shaped film substrate P and are arranged at the positions in a straight line shape along the longitudinal direction of the roll-shaped film substrate P.

The metal target 26a is a target of a metal element, and the metal target 26b is a target of a metalloid element.

With respect to the metal targets 26a and 26b, the sputter apparatus 21 uses a mixture of a plurality of elements containing at least one of non-metallic elements, one of metal elements, and one of metalloid elements as a single target. However, an integrated target of the metal targets 26a and 26b may be used.

In this manner, the sputter apparatus 21 introduces the atmosphere gas containing the non-metallic elements into the vacuum chamber 27 by using the gas introduction mechanism 29. A plurality of metal targets containing metal elements or metalloid elements of the metal targets 26a and 26b or a mixture thereof are disposed in the vacuum chamber 27. If a high voltage is applied to the metal targets 26a and 26b through electrodes, elements fly out from the surface of the metal target. The atmosphere gas containing the non-metallic elements introduced into the vacuum chamber 27 reacts with the flying-out metal, so that the active layer 203 can be formed on the roll-shaped film substrate P.

In the case of foaming the active layer 203, the roll-shaped film substrate P is maintained at the room temperature particularly without heating or cooling (however, it is considered that an increase in temperature naturally occurs by several tens ° C. due to high voltage applied to the metal targets 26a and 26b or reaction with flying-out elements). In addition, during the layer formation, an internal pressure of the vacuum chamber 27 is about 0.5 Pa, and a partial pressure of an atmosphere gas supplied from the gas introduction mechanism 29 is about 0.005 Pa. The layer formation power for applying a high voltage to the metal target is about 2 W/cm$^2$.

The sputter apparatus 21 can form the active layer 203 by a low-temperature process and can implement low process cost. In addition, it is possible to manufacture a thin film transistor B where the active layer 203 having a relatively high field effect mobility can be implemented and the properties are stabilized with respect to light and heat.

In addition, it is possible to manufacture a thin film transistor B where the band gap of the active layer 203 can be freely controlled, and the field effect mobility can be increased.

In addition, the sputter apparatus 21 includes a vacuum chamber 27 which accommodates all the mechanism in the inner portion thereof, and extracting from the rolled state and winding to the rolled state are performed during the manufacturing, so that a low-cost process can be implemented.

In addition, the sputter apparatus 21 introduces an atmosphere gas containing non-metallic elements into the vacuum chamber 27 and includes a plurality of metal targets 26a and 26b containing metal elements, metalloid elements, or a mixture thereof. The metal targets 26a and 26b are arranged at the positions in a straight line shape along the longitudinal direction of the roll-shaped film substrate P, so that an active layer 203 having uniform properties can be formed in the roll-shaped film substrate P.

In addition, the sputter apparatus 21 uses a mixture of a plurality of elements containing at least one of non-metallic elements, one of metal elements, and one of metalloid elements as a single target, so that the properties of the active layer 203 become more uniform and the cost of the sputtering process can be reduced.

In this manner, if the thin film transistor B is directly formed on the plastic substrate P, since the substrate is flexible, the substrate is very appropriate for a flexible display. In addition, in the case where the display is an organic EL display, the organic EL device is a totally-solid-state device and has no dependency of a viewing angle, and the organic EL device is appropriate for a flexible display.

In addition, a short-side length of a display screen of the organic EL display C is 465 mm or more. In a large-screen, high-accuracy organic EL display, low-temperature P-Si TFTs can be adopted. However, with respect to the size of a display screen using the low-temperature P-Si TFTs, a laser annealing apparatus which is an expensive manufacturing apparatus is needed, and due to the limitation of the size of the laser annealing apparatus, if the short-side length is not 465 mm or less, mass production cannot be made. However, using the thin film transistors B, it is possible to manufacture a manufacturing apparatus for the display screen having a short-side length of 465 mm or more with a relatively low production cost.

In addition, in the thin film transistor forming process S2, the thin film transistor B is transparent, a portion of the organic EL device A is two-dimensionally and continuously formed through an insulating planarizing layer 300 which is a transparent insulating layer on the thin film transistor B, and a lower electrode 301 of the organic EL device A is transparent. Since the transparent thin film transistor B, the insulating planarizing layer 300 as an insulating material, and the lower electrode 301 of the organic EL device A are used, although a large-size thin film transistor B is used, the light emission of the organic EL device A can be used for display without blocking thereof. Accordingly, an aperture ratio of the display can be increased, and light use efficiency can be improved, so that the embodiment is appropriate for saving energy.

In addition, in the thin film transistor forming process S2, the thin film transistor B is directly formed on the plastic substrate P. In the embodiment, since the substrate is flexible, the substrate is very appropriate for a flexible display. In addition, in the case where the display is an organic EL display, the organic EL device is a totally-solid-state device and has no dependency of a viewing angle, and the organic EL device is appropriate for a flexible display.

In addition, in the thin film transistor forming process S2, the thin film transistor B includes a glass substrate 600. With respect to a thin film transistor which requires a high-temperature process so that the thin film transistor cannot be directly formed on the plastic substrate P, there is an advantage in that, after the thin film transistor is separately produced on the glass substrate 600, the thin film transistor can be used in the state where the thin film transistor is attached on the plastic substrate P by using a cohesive layer or an adhesive layer. In this case, if the thickness of the glass substrate 600 is reduced through etching using hydrogen fluoride water or the like or through polishing using a polishing agent, it is effective in reducing the thickness of the device.

Second Embodiment

Although the configuration of the second embodiment is similar to that of the first embodiment, the organic EL device portion forming process S3 includes a process of forming layers of emitting light of at least three primary colors of red (R), green (G), and blue (B) in the organic EL device A. In the case where full-color display is performed by an organic EL display C, a configuration for emitting light of at least three primary colors of red (R), green (G), and blue (B) is needed. In this case, since the emitted light of the organic EL device A is directly used as it is, the light use efficiency is the highest among full-color display methods, which is preferable. A configuration for emitting light of four colors or six colors including white (W), yellow (Y), cyan (C), and the like in addition to RGB may be used.

Third Embodiment

Although the configuration of the third embodiment is similar to that of the first embodiment, the organic EL device portion forming process S3 includes a process of forming at least a white light emitting layer and a color filter layer in the organic EL device A. Instead of emitting light of three primary colors or light of four colors to six colors, full color display can be made by using a white light emitting layer and a color filter layer. In this case, since only a single white light emitting layer may be formed as the light emitting layer, there is no need to form separate light emitting layers for different colors of the emitted light. Therefore, the number of processes can be reduced, and the manufacturing apparatus is more simplified, so that it is effective in that the manufacturing can be performed with a more inexpensive apparatus. Similarly to a color liquid crystal panel, the full color display is performed by allowing the light from the white light emitting layer to transmit through the color filter layer.

The present invention can be particularly applied to an organic EL display which is configured by using a plastic substrate and is driven by a thin film transistor including an active layer containing non-metallic elements and a method of manufacturing the organic EL display, and it is possible to manufacture a large-size, high-accuracy organic EL display using a plastic substrate and an organic EL display using a roll-shaped long plastic substrate.

What is claimed is:

1. An organic EL display which includes an organic EL device having at least a lower electrode, an organic layer including at least a light emitting layer, and an upper electrode and a thin film transistor on a transparent plastic substrate,
    wherein a source electrode or a drain electrode of the thin film transistor is connected to the lower electrode,
    wherein the plastic substrate has a gas barrier layer,
    wherein the thin film transistor is formed on the gas barrier layer,
    wherein the thin film transistor includes an active layer containing a non-metallic element which is a mixture of oxygen and nitrogen and has a ratio of nitrogen number density to oxygen number density of from 0 to 2, and
    wherein the organic EL device is formed at least on the gas barrier layer or on the thin film transistor.

2. The organic EL display according to claim 1, wherein a short-side length of a display screen of the organic EL display is 465 mm or more.

3. The organic EL display according to claim 1, wherein the organic EL device includes layers of emitting at least three primary colors of red, green, and blue.

4. The organic EL display according to claim 1, wherein the organic EL device includes at least a white light emitting layer and a color filter layer.

5. The organic EL display according to claim 1,
    wherein the thin film transistor is transparent,
    wherein a portion of the organic EL device is two-dimensionally and continuously formed through a transparent insulating layer on the thin film transistor, and
    wherein the lower electrode of the organic EL device is transparent.

6. The organic EL display according to claim 1, wherein the upper electrode of the organic EL device is a light-reflective electrode.

7. The organic EL display according to claim 1, wherein the thin film transistor includes a cohesive layer or an adhesive layer at a side of the gas barrier layer.

8. The organic EL display according to claim 7, wherein the thin film transistor includes a glass substrate.

9. The organic EL display according to claim 1, wherein the thin film transistor is directly formed on the plastic substrate.

10. A method of manufacturing the organic EL display according to claim 1, comprising at least:
    forming an organic EL device portion by forming at least a lower electrode, an organic layer including at least a light emitting layer, and an upper electrode on a transparent plastic substrate;
    forming a gas barrier layer on the transparent plastic substrate which has a shape of a long roll;
    forming a thin film transistor by forming an active layer containing a non-metallic element which is a mixture of oxygen and nitrogen and has a ratio of nitrogen number density to oxygen number density of from 0 to 2 on the gas barrier layer through a sputtering method; and
    forming the organic EL device at least on the gas barrier layer or on the thin film transistor.

11. The method according to claim 10, wherein a short-side length of a display screen of the organic EL display is 465 mm or more.

12. The method according to claim 10, further comprising a step of forming layers of emitting at least three primary colors of red, green, and blue in the organic EL device.

13. The method according to claim 10, further comprising a step of forming at least a white light emitting layer and a color filter layer in the organic EL device.

14. The method according to claim 10,
    wherein the thin film transistor is transparent,
    wherein a portion of the organic EL device is two-dimensionally and continuously formed through a transparent insulating layer on the thin film transistor, and
    wherein the electrode of the organic EL device is transparent.

15. The method according to claim 10, wherein the thin film transistor is formed by being transferred to the plastic substrate through a cohesive layer or an adhesive layer, after the thin film transistor is formed on a glass substrate in advance and a portion or the entire of the glass substrate is removed.

16. The method according to claim 10, wherein the thin film transistor is directly formed on the plastic substrate.

* * * * *